(12) United States Patent
Ryoo et al.

(10) Patent No.: US 8,043,924 B2
(45) Date of Patent: Oct. 25, 2011

(54) METHODS OF FORMING PHASE-CHANGE MEMORY UNITS, AND METHODS OF MANUFACTURING PHASE-CHANGE MEMORY DEVICES USING THE SAME

(75) Inventors: Kyung-Chang Ryoo, Gyeonggi-do (KR); Hong-Sik Jeong, Gyeonggi-do (KR); Gi-Tae Jeong, Seoul (KR); Jung-Hoon Park, Seoul (KR); Yoon-Jong Song, Seoul (KR)

(73) Assignee: Samsung Electronics Co., Ltd. (KR)

( * ) Notice: Subject to any disclaimer, the term of this patent is extended or adjusted under 35 U.S.C. 154(b) by 91 days.

(21) Appl. No.: 12/420,888

(22) Filed: Apr. 9, 2009

(65) Prior Publication Data
US 2009/0258477 A1    Oct. 15, 2009

(30) Foreign Application Priority Data

Apr. 11, 2008    (KR) ........................ 10-2008-0033916

(51) Int. Cl.
*H01L 21/82*    (2006.01)
*H01L 21/36*    (2006.01)
*H01L 21/4763*    (2006.01)
*H01L 21/20*    (2006.01)

(52) U.S. Cl. ........ 438/337; 438/128; 438/483; 438/478; 438/479; 438/637; 257/E21.209; 257/E21.662; 257/E21.663; 257/E21.687; 257/E21.688

(58) Field of Classification Search ........... 257/E21.585, 257/E21.586, E21.591
See application file for complete search history.

(56) References Cited

U.S. PATENT DOCUMENTS

| | | | |
|---|---|---|---|
| 7,682,945 B2 * | 3/2010 | Lam et al. | 438/479 |
| 2007/0117412 A1 * | 5/2007 | Goo et al. | 438/787 |
| 2007/0158645 A1 | 7/2007 | Lung | |
| 2007/0272950 A1 * | 11/2007 | Kim et al. | 257/211 |
| 2008/0064217 A1 * | 3/2008 | Horii | 438/703 |
| 2008/0272358 A1 * | 11/2008 | Lin et al. | 257/4 |
| 2009/0017577 A1 * | 1/2009 | An et al. | 438/102 |
| 2009/0032796 A1 * | 2/2009 | Lung | 257/5 |
| 2010/0117046 A1 * | 5/2010 | Chang et al. | 257/3 |

FOREIGN PATENT DOCUMENTS

| | | |
|---|---|---|
| KR | 10-0615583 | 8/2006 |
| KR | 10-0626388 | 9/2006 |
| KR | 1020070069767 | 7/2007 |

* cited by examiner

*Primary Examiner* — Mohsen Ahmadi
(74) *Attorney, Agent, or Firm* — Myers Bigel Sibley & Sajovec

(57) ABSTRACT

In a method of forming a phase-change memory unit, a conductive layer is formed on a substrate having a trench. The conductive layer is planarized until the substrate is exposed to form a first electrode. A spacer partially covering the first electrode is formed. A phase-change material layer is formed on the first electrode and the second spacer. A second electrode is formed on the phase-change material layer. Reset/set currents of the phase-change memory unit may be reduced and deterioration of the phase-change material layer may be reduced and/or prevented.

6 Claims, 21 Drawing Sheets

METHODS OF FORMING PHASE-CHANGE MEMORY UNITS, AND METHODS OF MANUFACTURING PHASE-CHANGE MEMORY DEVICES USING THE SAME

RELATED APPLICATION

This application claims priority under 35 U.S.C. §119 to Korean Patent Application No. 10-2008-0033916, filed on Apr. 11, 2008 in the Korean Intellectual Property Office (KIPO), the disclosure of which is herein incorporated by reference in its entirety.

BACKGROUND

1. Field

Example embodiments relate to methods of forming phase-change memory units, methods of manufacturing phase-change memory devices using the same and phase-change memory devices manufactured using the same. More particularly, example embodiments relate to phase-change memory units having an improved electrode structure, methods of manufacturing phase-change memory devices using the same and phase-change memory devices manufactured using the same.

2. Description of the Related Art

Generally, data is stored in a cell of a phase-change memory (PRAM) device using a resistance difference between an amorphous state and a crystalline state of a phase-change material layer including a chalcogenide material. That is, data "0" or "1" are stored in the cell of the PRAM device using a reversible phase change of the phase-change material layer including the chalcogenide material, which may occur according to the amplitude and wavelength of a pulse applied to the phase-change material layer. For example, a reset current needed to change the phase-change material layer from a crystalline state into an amorphous state and a set current needed to change the phase-change material layer from the amorphous state into the crystalline state may flow from a transistor or a diode through a lower electrode to the phase-change material layer, thereby changing the phase of the phase-change material layer.

A phase change of the phase-change material layer may be due to Joule's heat, which is generated as reset/set currents flow through a lower electrode. In order to effectively transfer heat generated using low reset/set currents, it may be desirable to attempt to prevent heat from diffusing into other regions excluding the phase-change material layer, and a contact area between the phase-change material layer and the electrode may be decreased.

Various lower electrode structures have been developed. For example, a structure including a cylindrical conductive contact as a heat generator may be provided on the lower electrode. However, the cylindrical conductive contact is formed by an etching process so that the cylindrical conductive contact may not have a desirable area due to resolution limits of a photolithography process used to form the contact.

The phase-change material layer formed on the cylindrical contact may be patterned by an etching process, such as a photolithography process, and thus the phase-change material layer may be deteriorated by damage generated during the etching process.

SUMMARY

Example embodiments provide methods of forming phase-change memory units including an improved electrode structure and an improved phase-change material layer.

Example embodiments provide methods of manufacturing a phase-change memory device including an improved electrode structure and an improved phase-change material layer.

Example embodiments provide phase-change memory devices including an improved electrode structure and an improved phase-change material layer.

According to some embodiments, there is provided a method of forming a phase-change memory unit. In the method, a conductive layer is formed on a substrate having a trench. The conductive layer is planarized until the substrate is exposed to form a first electrode. A second spacer partially covering the first electrode is formed. A phase-change material layer is formed on the first electrode and the second spacer. A second electrode is formed on the phase-change material layer.

In some embodiments, prior to planarizing the conductive layer, portions of the conductive layer on a lower face of the trench may be selectively removed to form a plurality of conductive layer patterns.

In some embodiments, in removing the conductive layer on the lower face of the trench, a spacer layer may be formed on the conductive layer and then may be selectively removed to form a first spacer. An etching process may be performed using the first spacer as an etching mask to selectively remove portions of the conductive layer from the lower face of the trench. After removing portions of the conductive layer, the first spacer may be removed.

In some embodiments, prior to forming the second spacer, an insulation layer may be formed to at least partially fill up the trench. In formation of the second spacer, a second spacer layer may be formed on the insulation layer and the first electrode. Portions of the second spacer layer may be selectively removed to partially expose the first electrode.

In some embodiments, a plurality of trenches may be spaced apart along a second direction, and each of the trenches may extend along a first direction substantially perpendicular to the second direction.

In some embodiments, before the conductive layer is planarized, the first spacer layer may be formed on the conductive layer and then may be selectively patterned to form a plurality of first spacers that are spaced apart along the second direction. Each of the first spacers may extend along the first direction and may partially cover the conductive layer on a sidewall and the lower face of the trench. An etching process may be performed using the plurality of first spacers as the etching mask to selectively remove portions of the conductive layer from on the lower face of the trench. The first spacers may then be removed.

In some embodiments, a plurality of second spacers may be spaced apart along the first direction, and each of the second spacers may extend along the second direction.

In some embodiments, portions of the second electrode, the phase-change material layer, the second spacer and the first electrode may be selectively removed to form a plurality of openings exposing the substrate and extending along the second direction.

Some embodiments provide methods of manufacturing a phase-change memory device. In these methods, a first insulation layer and a diode that extends through the first insulation layer are formed on a substrate. A second insulation layer having a trench, which exposes the diode, is formed on the first insulation layer and the diode. A conductive layer is formed on the second insulation layer and the exposed diode. The conductive layer is planarized until the second insulation layer is exposed to form a first electrode. A second spacer partially covering the first electrode is formed. A phase-change material layer is formed on the first electrode and the second spacer. A second electrode is formed on the phase-change material layer.

In some embodiments, before the conductive layer is planarized, a first spacer layer may be formed on the conductive layer and may be patterned to form a first spacer. An etching process may be performed using the first spacer as an etching mask to selectively remove portions of the conductive layer from a lower face on the trench. After removing portions of the conductive layer, the first spacer may be removed.

In some embodiments, a plurality of diodes may be formed on the substrate and a plurality of trenches may be spaced apart along a second direction. Each of the trenches may extend along a first direction substantially perpendicular to the second direction.

In some embodiments, the first spacer layer may be formed on the conductive layer and then the first spacer layer may be patterned to form a plurality of first spacers. The plurality of first spacers may be spaced apart along the second direction. Each of the first spacers may extend along the first direction and partially cover the conductive layer on a sidewall and the lower face of the trench. An etching process may be performed using the plurality of first spacers as the etching mask to selectively remove portions of the conductive layer from the lower face of the trenches. The first spacers may then be removed.

In some embodiments, a plurality of second spacers may be spaced apart along the first direction and each of the second spacers may extend along the second direction.

In some embodiments, portions of the second electrode, the phase-change material layer, the second spacer and the first electrode may be removed to form a plurality of openings extending along the second direction and exposing the first insulation layer.

In some embodiments, a plurality of bit lines may be formed to extend along the second direction and be electrically connected to the second electrode.

According to some embodiments, there is provided a phase-change memory device. The phase-change memory device includes a diode, a first electrode, a spacer, a phase-change material layer and a second electrode. The diode is on the substrate. The first electrode electrically connected to the diode includes a first portion extending along a direction substantially perpendicular to the substrate and a second portion extending from the first portion along a second direction substantially parallel to the substrate and in contact with the diode. The spacer partially covers the first electrode. The phase-change material layer is on the first electrode and the spacer. The second electrode is on the phase-change material layer.

In some embodiments, a plurality of diodes may be spaced apart along the second direction to define a diode column, a plurality of first electrodes may be spaced apart along the second direction to define a first electrode column, and each of the first electrodes may be electrically connected to the each of the diode, respectively. The spacer, the phase-change material layer and the second electrode may extend along the second direction.

In some embodiments, the phase-change memory device may include a bit line electrically connected to the second electrode and extending along the second direction.

In some embodiments, a plurality of diode columns may be spaced apart along a first direction substantially perpendicular to the second direction to define a diode array and a plurality of first electrode columns may be spaced apart along the first direction to define a first electrode array. A plurality of spacers, a plurality of phase-change material layers and a plurality of second electrodes may be spaced apart along the first direction, and each of the spacers, each of the phase-change material layers and each of the second electrodes may extend along the second direction.

In some embodiments, the phase-change memory device may include a word line electrically connected to a plurality of diodes spaced apart along the first direction.

According to some embodiments, a phase-change memory unit may have a small contact area between a first electrode and a phase-change material layer. That is, the width of a contact area along a second direction may be determined by the thickness of a first conductive layer, while a length of the contact area in the first direction may be determined by spacing between second spacers in a first direction. A first conductive layer having a relatively small thickness may be formed, for example, by an atomic layer deposition (ALD) process. The length of the contact area along the first direction may be adjusted during formation of a second spacer, thereby having a small value. Accordingly, high Joule's heat may be obtained by low currents through the first electrode to form a phase-change memory unit having low reset/set currents.

The second spacer may define the contact area between the first electrode and the phase-change material layer. Thus, the contact area between the first electrode and the phase-change material layer may not be affected by damage due to an etching process for forming a phase-change material layer pattern, so that deterioration of the phase-change material layer pattern may be reduced and/or prevented.

BRIEF DESCRIPTION OF THE DRAWINGS

Example embodiments will be more clearly understood from the following detailed description taken in conjunction with the accompanying drawings. FIGS. 1A to 17B represent non-limiting, example embodiments as described herein.

FIGS. 1A, 2A, 3A, 4A, 5A, 6A and 7A and 1B, 2B, 3B, 4B, 5B, 6B and 7B are cross-sectional views illustrating methods of forming phase-change memory units in accordance with example embodiments.

FIGS. 8A, 9A, 10A, 11A, 12A, 13A, 14A, 15A, 16A and 17A and 8B, 9B, 10B, 11B, 12B, 13B, 14B, 15B, 16B and 17B are cross-sectional views illustrating methods of manufacturing phase-change memory devices in accordance with example embodiments.

DETAILED DESCRIPTION OF THE EMBODIMENTS

Figure 1A:
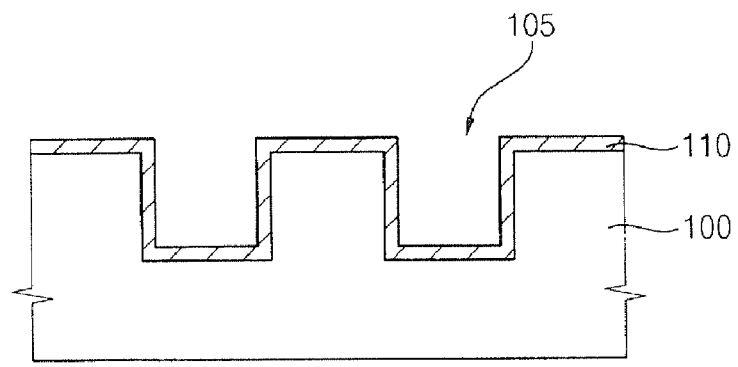

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Hereinafter, example embodiments will be explained in detail with reference to the accompanying drawings.

FIGS. 1A, 2A, 3A, 4A, 5A, 6A and 7A and 1B, 2B, 3B, 4B, 5B, 6B and 7B are cross-sectional views illustrating methods of forming phase-change memory units and FIGS. 1C, 2C, 3C, 4C, 5C, 6C and 7C are plan views illustrating methods of forming phase-change memory units in accordance with example embodiments. FIGS. 1A, 2A, 3A, 4A, 5A, 6A and 7A are cross-sectional views taken along a second direction of FIGS. 1C, 2C, 3C, 4C, 5C, 6C and 7C, respectively, as indicated by arrows A-A', and FIGS. 1B to 7B are cross-sectional views taken along a first direction of FIGS. 1C, 2C, 3C, 4C, 5C, 6C and 7C, respectively, as indicated by arrows B-B'. For example, the first and second direction may be substantially parallel to a trench 105 and a second spacer 140, respectively. The first direction may be substantially perpendicular to the second direction. FIGS. 1B to 7B are cross-sectional views taken along a first conductive layer 110 formed on a sidewall of the trench 105.

Figure 1B:
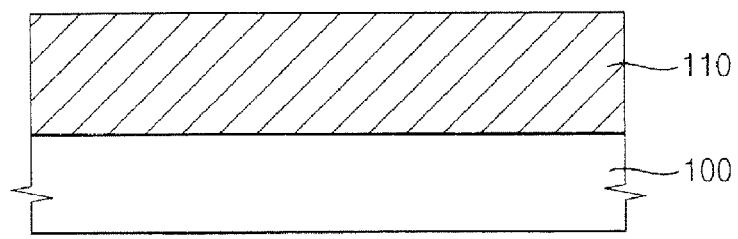
Figure 1C:
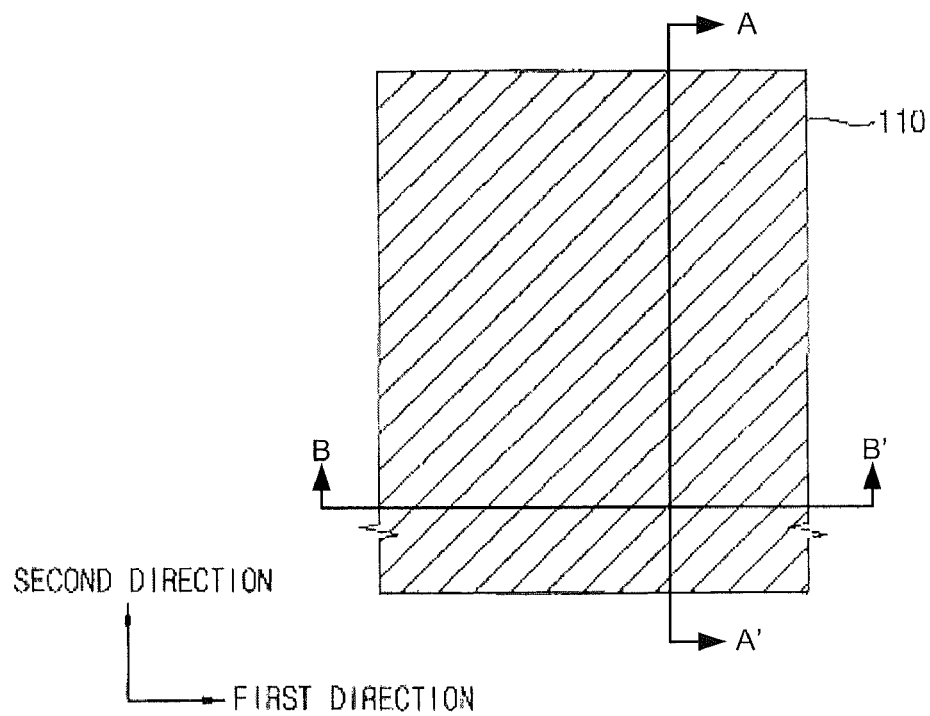
FIGS. 1C, 2C, 3C, 4C, 5C, 6C and 7C are plan views illustrating methods of forming phase-change memory units in accordance with example embodiments.

Referring to FIGS. 1A, 1B and 1C, the first conductive layer 110 is formed on a substrate 100 having the trench 105.

The substrate 100 may include a semiconductor substrate such as silicon substrate, a germanium substrate, a silicon-germanium substrate, etc. Alternatively, the substrate 100 may include a silicon-on-insulator (SOI) substrate or a germanium-on-insulator (GOI) substrate. In example embodiments, the substrate 100 may include an impurity region, a pad, a plug, a contact, a conductive layer pattern, an insulation layer pattern, etc.

The trench 105 may extend along the first direction. In example embodiments, a plurality of trenches 105 may be spaced apart from one another along the second direction.

The first conductive layer 110 may be formed using a metal and/or a metal compound such as a metal nitride, metal silicon nitride, etc. For example, the first conductive layer 110 may be formed using tungsten (W), aluminum (Al), copper (Cu), tantalum (Ta), titanium (Ti), molybdenum (Mo), niobium (Nb), zirconium (Zr), tungsten nitride, aluminum nitride, tantalum nitride, titanium nitride, molybdenum nitride, niobium nitride, zirconium nitride, tantalum aluminum nitride, titanium aluminum nitride, molybdenum aluminum nitride, zirconium aluminum nitride, molybdenum titanium nitride, tungsten boron nitride, titanium boron nitride, tungsten silicon nitride, tantalum silicon nitride, titanium silicon nitride, molybdenum silicon nitride and/or zirconium silicon nitride. These may be used alone or in a combination thereof.

The first conductive layer 110 may be formed by a deposition process, such as an atomic layer deposition (ALD) process, a chemical vapor deposition (CVD) process, a sputtering process, a cyclic chemical vapor deposition (cyclic CVD) process, an electron beam deposition (EBD) process, etc. The thickness of the first conductive layer 110 may affect a contact area between a phase-change material layer 150 (see FIG. 6A) and a first electrode 117 (see FIG. 4A). That is, as the thickness of the first conductive layer 110 is decreased, the contact area between the phase-change material layer 150 and the first electrode 117 may be reduced. Accordingly, the first conductive layer 110 having a relatively small thickness may be formed. In example embodiments, the first conductive layer 110 may have a thickness of about 5 nm to about 10 nm.

Figure 2A:
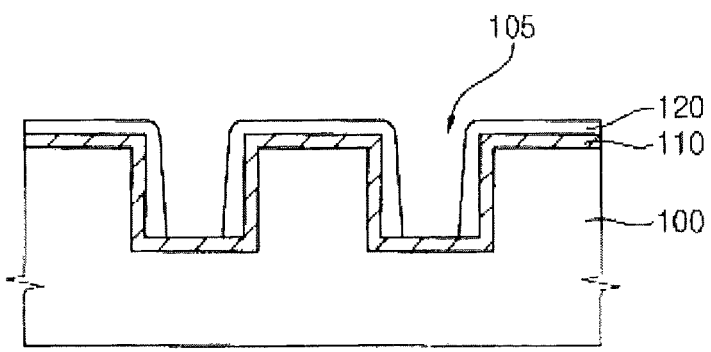
Figure 2B:
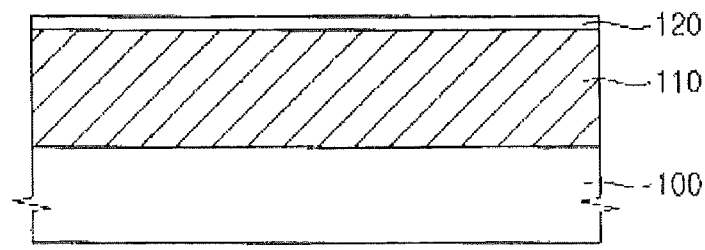
Figure 2C:
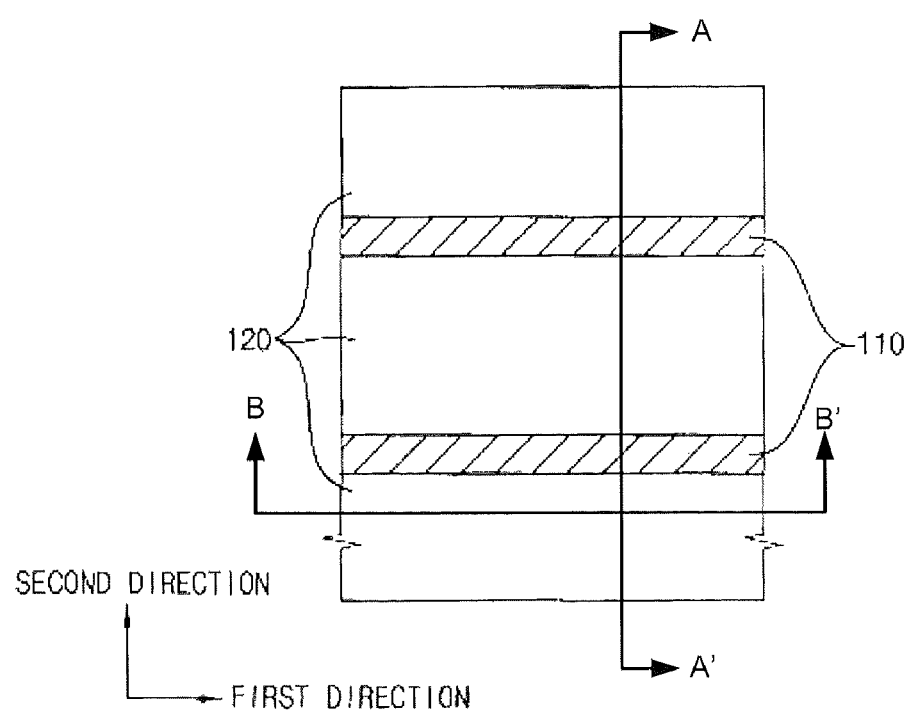

Referring to FIGS. 2A, 2B and 2C, a first spacer layer is formed on the first conductive layer 110. The first spacer layer may be formed using a nitride such as silicon nitride and/or an oxynitride such as silicon oxynitride. The first spacer layer may be formed by a deposition process, such as a CVD process, a low-pressure chemical vapor deposition (LPCVD) process, a plasma-enhanced chemical vapor deposition (PECVD) process, a high-density plasma chemical vapor deposition (HDP-CVD) process, etc.

The first spacer layer may be partially removed from the first conductive layer 110 to form a first spacer 120. In particular embodiments, the first spacer layer may be partially removed to expose a portion of the first conductive layer 110 formed on a lower face of the trench 105. Portions of the first spacer layer may be removed by an etch-back process.

Figure 3A:
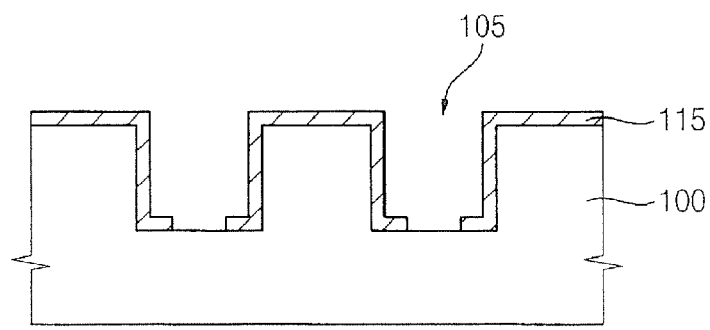
Figure 3B:
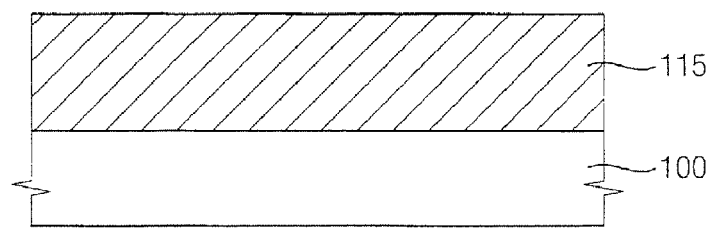
Figure 3C:
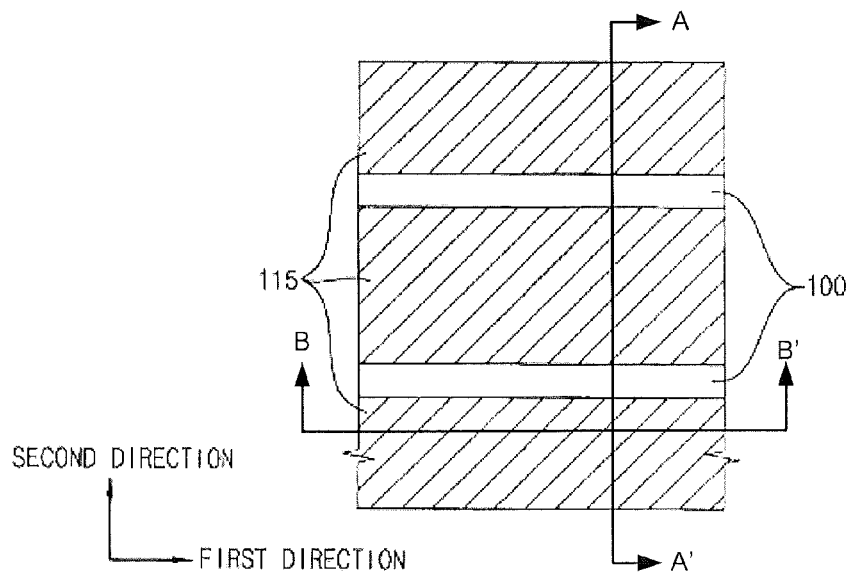

Referring to FIGS. 3A, 3B and 3C, the exposed portion of the first conductive layer 110 is removed by performing an etching process using a first spacer 120 as etching mask to form a plurality of first conductive layer patterns 115. The first conductive layer patterns 115 partially expose the lower face of the trench 105. Each of the first conductive layer patterns 115 may extend along the first direction and a plurality of first conductive layer patterns 115 may be spaced apart from one another along the second direction. After the etching process, the first spacer 120 is removed from the substrate 100.

Figure 4A:
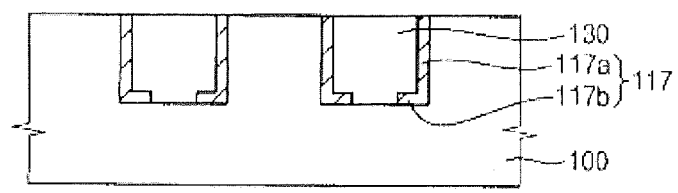
Figure 4B:
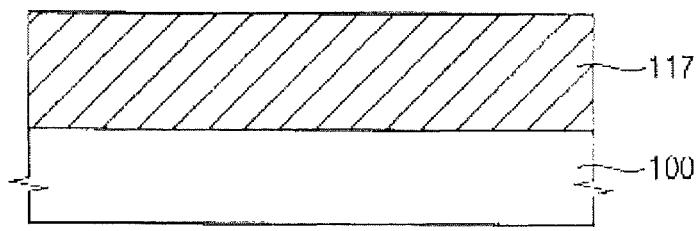
Figure 4C:
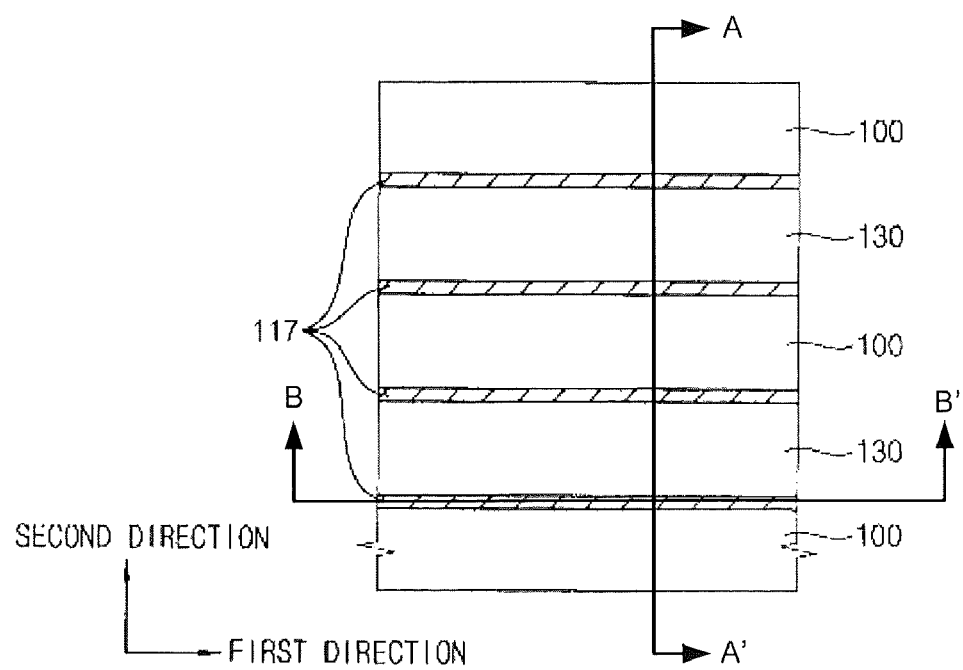

Referring to FIGS. 4A, 4B and 4C, a first insulation layer is formed on the substrate 100 and the first conductive layer patterns 115 to fill up the trenches 105. The first insulation layer may be formed using silicon oxide, such as borophosphosilicate glass (BPSG), phosphosilicate glass (PSG), undoped silicate glass (USG), spin-on glass (SOG), flowable oxide (FOx), tetraethyl orthosilicate (TEOS), plasma-enhanced tetraethyl orthosilicate (PE-TEOS), high-density plasma chemical vapor deposition (HDP-CVD) oxide, etc. The first insulation layer may be formed by a deposition process, such as a CVD process, an LPCVD process, a PECVD process, a HDP-CVD process, etc.

A planarization process is performed at an upper portion of the first insulation layer and the first conductive layer patterns 115 to form first insulation layer pattern 130 and the first electrodes 117. The planarization process may be performed by a chemical mechanical polishing (CMP) process, an etch-back process, and/or a combination of such processes. A plurality of first insulation layer patterns 130 may be spaced apart from one another along the second direction and each of first insulation layer patterns 130 may extend along the first direction. Each of the first electrodes 117 may include a first portion 117a and a second portion 117b and extend along the first direction. The first portion 117a may be formed on a sidewall of the trench 105 along a direction substantially perpendicular to the substrate 100 and the second portion 117b may be formed on the lower face of the trench 105 along the second direction.

Each of the first electrodes 117 is exposed by the planarization process. The exposed portion of the first electrode 117 may make contact with the phase-change material layer 150 in subsequent processes. When the first conductive layer 110 has the thickness of about 5 nm to about 10 nm, the exposed portion of the first electrode 117 may have a width of about 5 nm to about 10 nm along the second direction. Accordingly, the contact area between the first electrode 117 and the phase-change material layer 150 may be reduced.

Figure 5A:
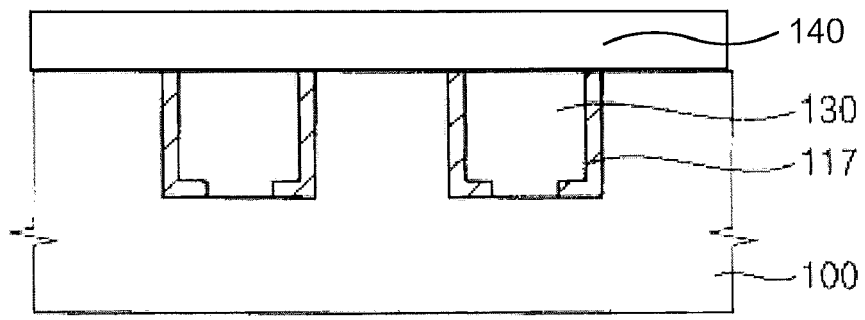
Figure 5B:
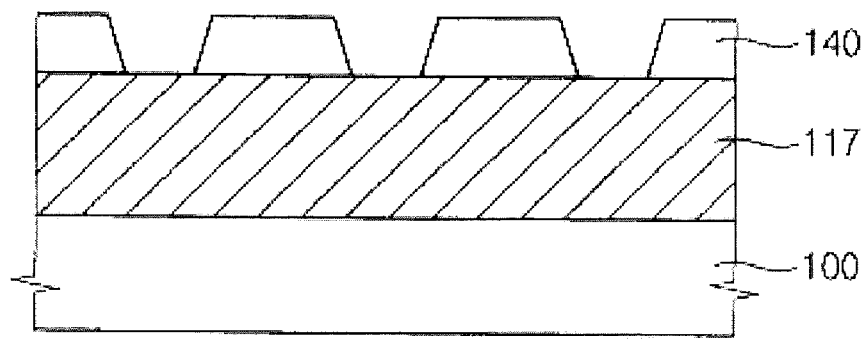
Figure 5C:
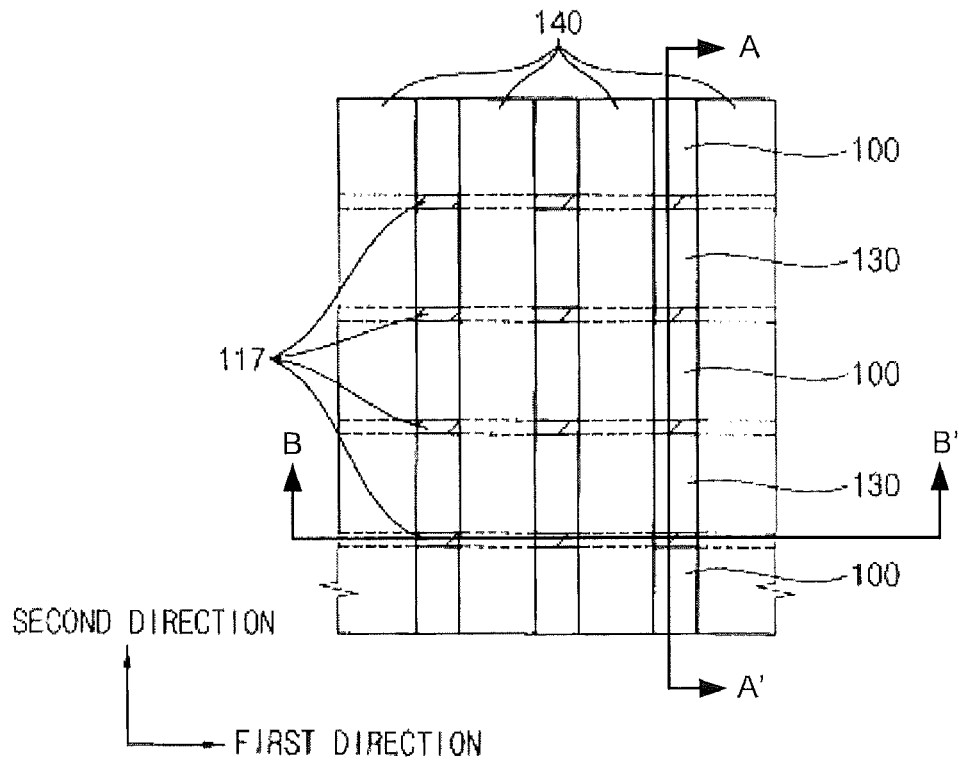

Referring to FIGS. 5A, 5B and 5C, a second spacer 140 is formed on the substrate 100, the first insulation layer pattern 130 and the first electrodes 117. The first electrodes 117 are partially exposed by the second spacer 140.

A second spacer layer may be formed on the substrate 100, the first insulation layer pattern 130 and the first electrodes 117. The second spacer layer may be formed using a material having an etching selectivity relative to the first insulation layer patterns 130. For example, the second spacer layer may be formed using a nitride, an oxynitride, etc. The second spacer layer may be fanned by a deposition process, such as a CVD process, an LPCVD process, a PECVD process, a HDP-CVD process, etc. The second spacer layer may be partially removed by performing a photolithography process using a photoresist pattern, which may extend along the second direction, to form the second spacer 140 extending along the second direction. Thus, the first electrodes 117, the substrate 100 and the first insulation layer patterns 130 may be partially exposed by the second spacer 140 along the second direction. In example embodiments, a plurality of second spacers 140 may be spaced apart from one another along the first direction.

Figure 6A:
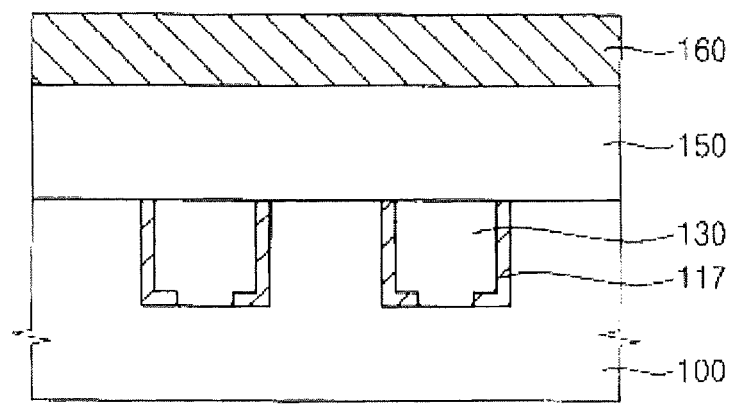
Figure 6B:
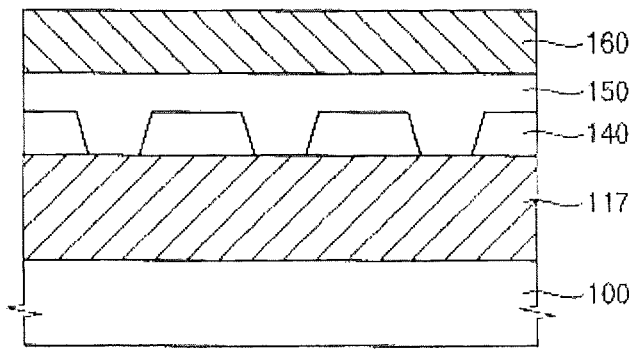
Figure 6C:
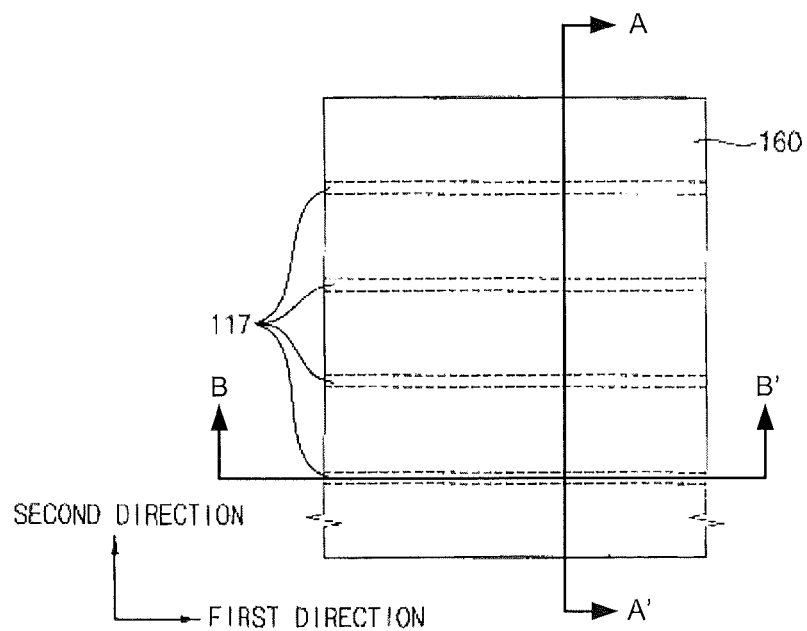

The portion of each of the first electrodes 117 exposed by the second spacer 140 may make contact with the phase-change material layer 150 (FIGS. 6A, 6B and 6C). Accordingly, the contact area between the exposed portion of the first electrode 117 and the phase-change material layer 150 may be adjusted by a removed region of the second spacer layer. In example embodiments, the second spacer layer may be removed to expose the first electrode 117 by a width of about 30 nm to about 50 nm along the first direction.

Referring to FIGS. 6A, 6B and 6C, the phase-change material layer 150 and the second electrode 160 are sequentially formed on the second spacer 140, the substrate 100 and the first insulation layer pattern 130 to cover the exposed portion of the first electrode 117.

The phase-change material layer 150 may be formed using a chalcogenide material such as germanium-antimony-tellurium (GST), GST doped with carbon, nitrogen and/or a metal, etc. by a physical vapor deposition (PVD) process. In some embodiments, the phase-change material layer 150 may be formed by a sputtering process.

The second electrode 160 may be formed using a metal and/or a metal compound such as a metal nitride, a metal silicon nitride, etc. For example, the second electrode 160 may be formed using tungsten, aluminum, copper, tantalum, titanium, molybdenum, niobium, zirconium, tungsten nitride, aluminum nitride, tantalum nitride, titanium nitride, molybdenum nitride, niobium nitride, zirconium nitride, tantalum aluminum nitride, titanium aluminum nitride, molybdenum aluminum nitride, zirconium aluminum nitride, molybdenum titanium nitride, tungsten boron nitride, titanium boron nitride, tungsten silicon nitride, tantalum silicon nitride, titanium silicon nitride, molybdenum silicon nitride and/or zirconium silicon nitride. These may be used alone or in a combination thereof. The second electrode 160 may be formed by a deposition process, such as an ALD process, a CVD process, a sputtering process, a cyclic CVD process, an EBD process, etc.

Figure 7A:
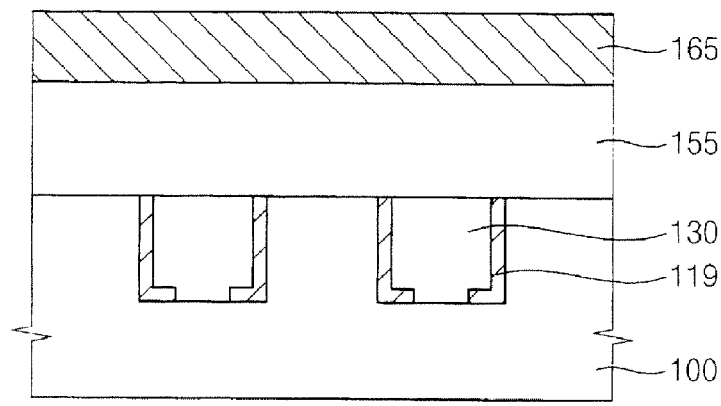
Figure 7B:
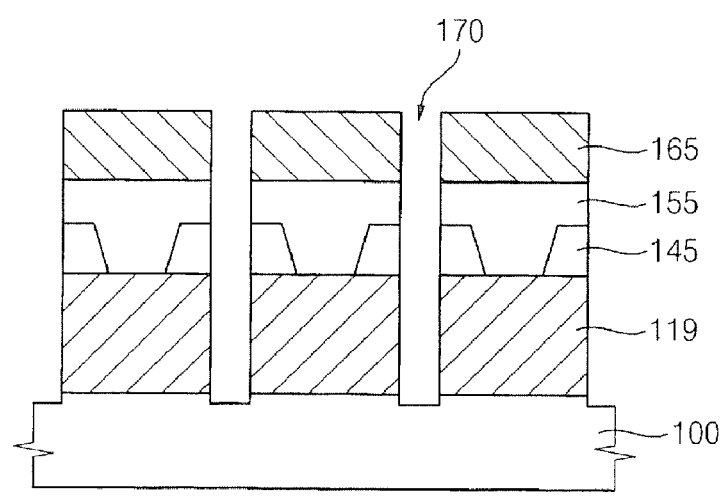
Figure 7C:
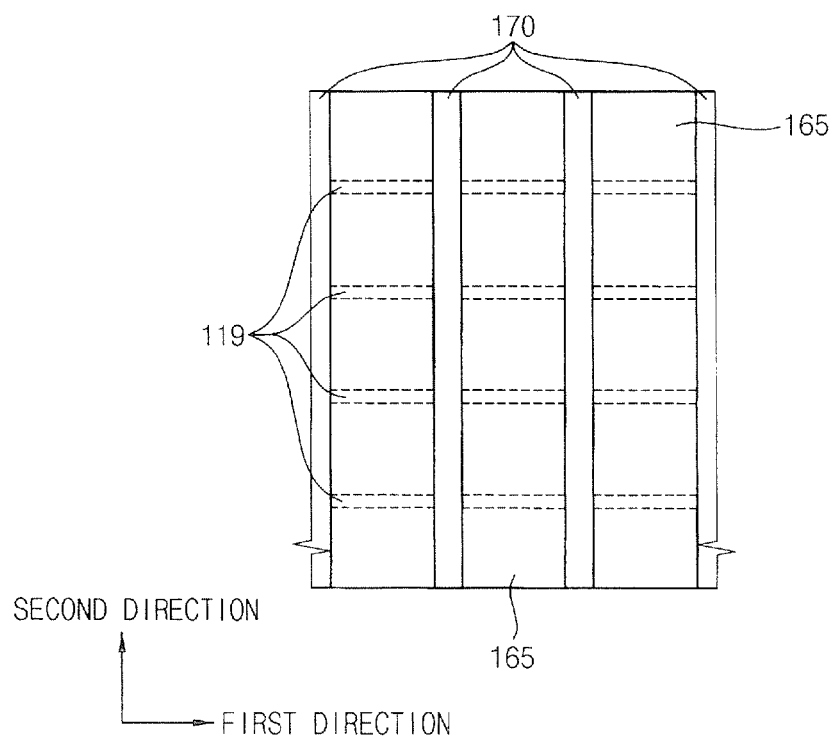

Referring to FIGS. 7A, 7B and 7C, the second electrode 160, the phase-change material layer 150, the second spacer 140 and the first electrode 117 are partially removed by an etching process to form an opening 170. The substrate 100 may be partially removed during formation of the opening 170. A plurality of openings 170 may be spaced apart from one another along the first direction and each of the openings 170 may extend along the second direction. Accordingly, a phase-change memory unit including a first electrode pattern 119, a second spacer pattern 145, a phase-change material layer pattern 155 and a second electrode pattern 165 is formed on the substrate 100. A plurality of phase-change memory units may be spaced apart from one another along the first direction.

The second electrode pattern 165 and the phase-change material layer pattern 155 may extend along the second direction. In some embodiments, a photolithography process may further performed using a photoresist pattern, which extends along the first direction, to partially remove the second electrode pattern 165 and the phase-change material layer pattern 155. Accordingly, in some embodiments, a plurality of second electrode patterns 165 and a plurality of phase-change material layer patterns 155 may have an isolated island shape.

According to some example embodiments, the contact area between the first electrode pattern 119 and the phase-change material layer pattern 155 may be small. That is, the width of the contact area along the second direction may be determined by the thickness of the first conductive layer 110. The first conductive layer having a thin thickness may be formed by an ALD process. The width of the contact area along the first direction may be adjusted during formation of the second spacer 140, thereby having a small value. Accordingly, high Joule's heat may be obtained by low currents through the first electrode pattern 119 to form a phase-change memory unit having low reset/set currents.

The second spacer 140 may define the contact area between the first electrode pattern 119 and the phase-change material layer 150. Thus, the contact area between the first electrode pattern 119 and the phase-change material layer 150 may not be affected by damage due to the etching process for forming the phase-change material layer 150 so that deterioration of the phase-change material layer 150 may be reduced and/or prevented.

FIGS. 8A, 9A, 10A, 11A, 12A, 13A, 14A, 15A, 16A and 17A and 8B, 9B, 10B, 11B, 12B, 13B, 14B, 15B, 16B and 17B are cross-sectional view illustrating methods of manufacturing a phase-change memory device in accordance with example embodiments. FIGS. 8A, 9A, 10A, 11A, 12A, 13A, 14A, 15A, 16A and 17A are cross-sectional views taken along a second direction of the phase-change memory device and FIGS. 8B to 17B are cross-sectional views taken along a first direction substantially perpendicular to the first direction of the phase-change memory device. For example, the first and second directions may be substantially parallel to a word line 370 and a bit line 340 in the phase-change memory device, respectively. FIGS. 8B to 17B are cross-sectional views taken along a first conductive layer 240 formed on a sidewall of a second trench 215 of the phase-change memory device.

A method of manufacturing the phase-change memory unit included in the phase-change memory device may be substantially the same as or similar to those methods illustrated with reference to FIGS. 1A to 7C, and thus detailed explanations about like elements are omitted here for the purpose of brevity.

Figure 8A:
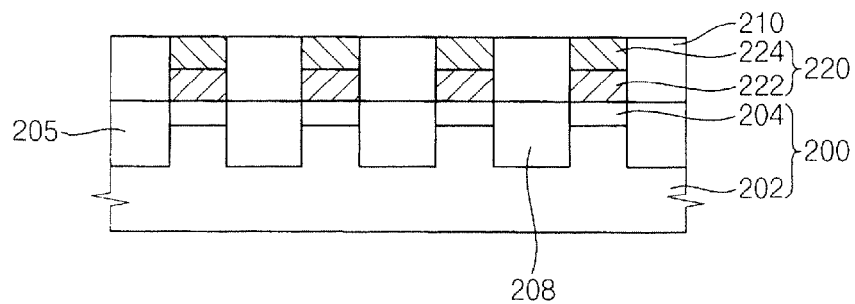
Figure 8B:
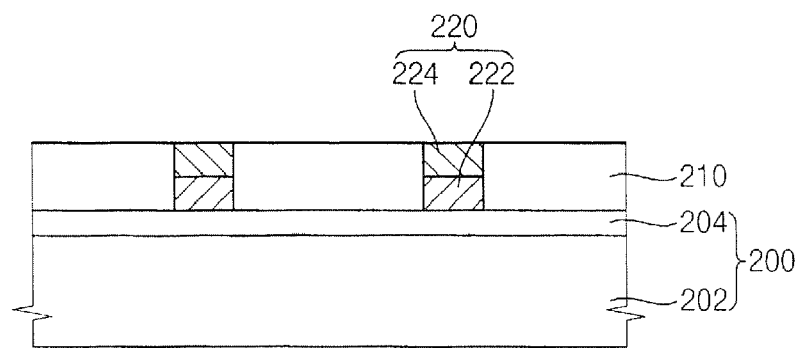

Referring to FIGS. 8A and 8B, a first impurity region is formed on a substrate 200. First impurities having a first-type conductivity may be implanted into the substrate 200 to form the first impurity region on the substrate 200. In example embodiments, the first impurities may include N-type impurities such as phosphorous (P), arsenic (As), etc. A well region 202 is formed below the first impurity region. Second impurities having a second-type conductivity may be implanted into the substrate 200 to form the well region 202. The second-type impurity may include P-type impurities such as boron (B), gallium (Ga), etc.

A first trench 208 is formed in the substrate 200 to define first impurity region patterns 204. Each of the first impurity region patterns 204 may extend along the first direction and a plurality of first impurity region patterns 204 may be spaced apart from one another along the second direction. An isolation layer 205 is formed to cover the first trench 208. The isolation layer 205 may be formed on the substrate 200 using silicon oxide, such as BPSG, PSG, USG, SOG, FOx, TEOS, PE-TEOS, HDP-CVD oxide, etc. by a deposition process, such as a CVD process, an LPCVD process, a PECVD process and/or or a HDP-CVD process. Then, a planarization process may be performed at the isolation layer 205.

A first insulation layer is formed on the first impurity region patterns 204 and the isolation layer 205. The first insulation layer may be formed using BPSG, PSG, USG, SOG, FOx, TEOS, PE-TEOS, HDP-CVD oxide, etc. by a CVD process, an LPCVD process, a PECVD process or a HDP-CVD process.

The first insulation layer is partially removed to form a first opening exposing the first impurity region patterns 204 and first insulation layer patterns 210. A silicon layer is formed on the first insulation layer patterns 210 and the first impurity region patterns 204 to fill up the first opening. The silicon layer is removed until the first insulation layer patterns 210 are exposed to form first silicon layer patterns filling up the first opening on the first impurity region patterns 204.

Third impurities having the second-type conductivity are implanted into an upper portion of the first silicon layer pattern to form an upper conductive layer pattern 224 and fourth impurities having the first-type conductivity are implanted into a lower portion of the first silicon layer pattern to form a lower conductive layer pattern 222. Accordingly, a diode 220 including the upper and lower conductive layer patterns 224 and 222 is formed in the first opening.

In example embodiments, an ohmic layer (not illustrated) may be further formed on the diode 220 using a metal silicide.

Figure 9A:
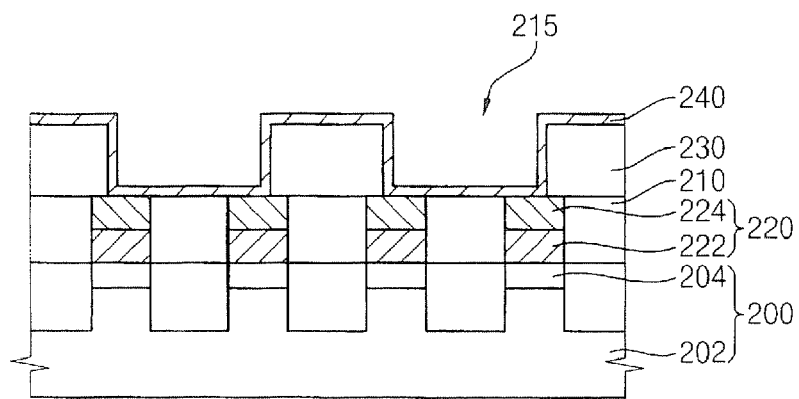
Figure 9B:
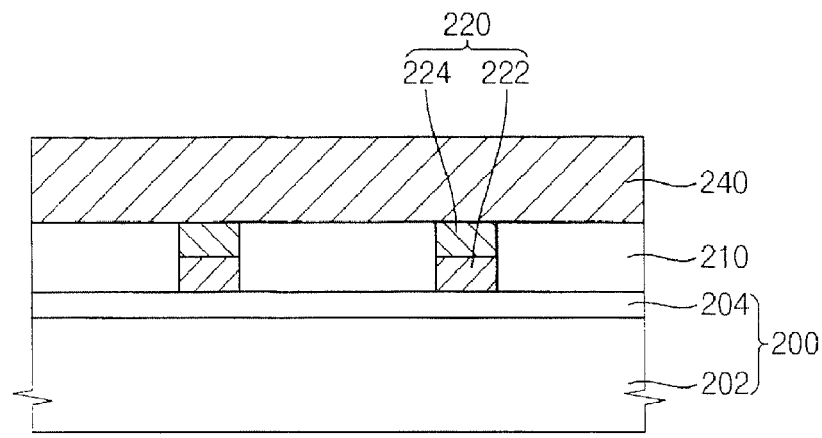

Referring to FIGS. 9A and 9B, a second insulation layer is formed on the first insulation layer patterns 210 and the diode 220. The second insulation layer is partially removed to form second insulation layer patterns 230 and a second trench 215 partially exposing the diode 220. The second trench 215 may extend along the first direction. In example embodiments, a plurality of second trenches 215 may be spaced apart from one another along the second direction.

A first conductive layer 240 is formed on a lower face and a sidewall of the second trench 215 and the second insulation layer patterns 230. The first conductive layer 240 may be formed using a metal and/or a metal compound, such as a metal nitride, metal silicon nitride, etc. by a deposition process, such as an ALD process, a CVD process, a sputtering process, a cyclic CVD process, an EBD process, etc.

Figure 10A:
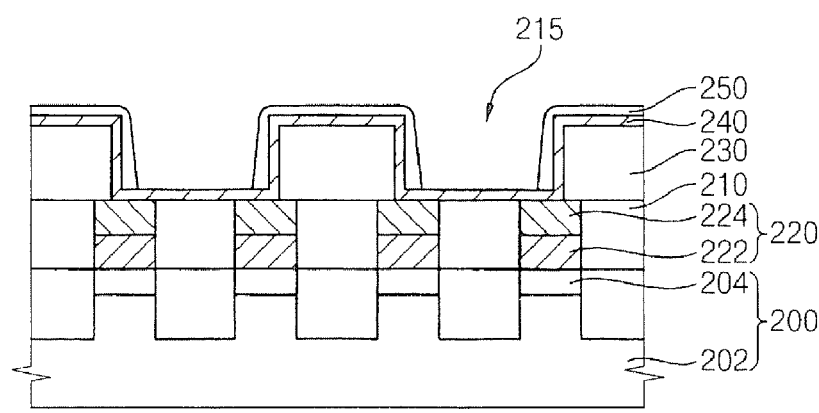
Figure 10B:
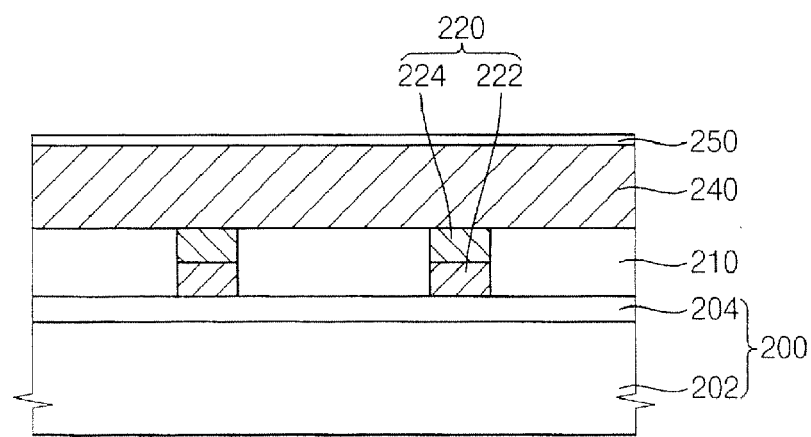

Referring to FIGS. 10A and 10B, a first spacer layer is formed on the first conductive layer 240. The first spacer layer may be formed using a nitride such as silicon nitride or an oxynitride such as silicon oxynitride. The first spacer layer is partially removed by an etch-back process to form a first spacer 250. The first spacer 250 partially exposes the first conductive layer 240 on the lower face on the second trench 215.

Figure 11A:
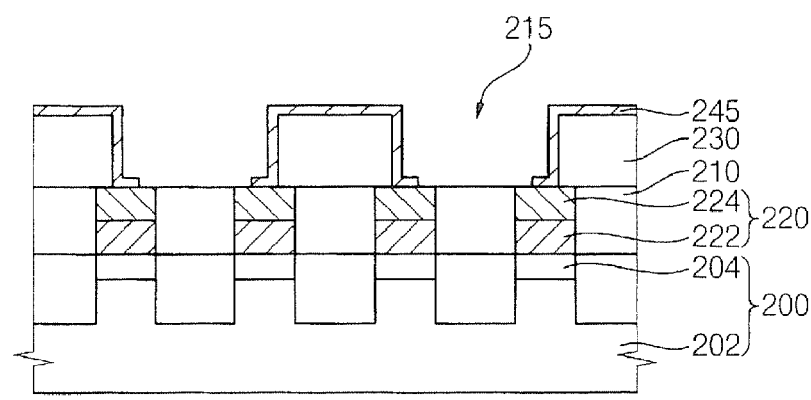
Figure 11B:
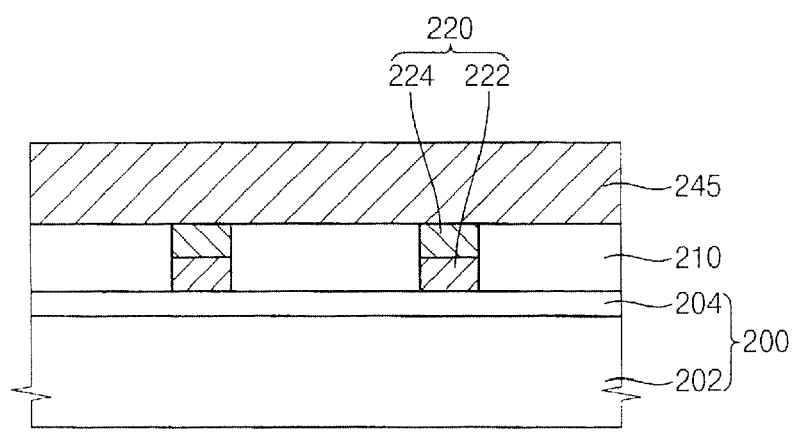

Referring to FIGS. 11A and 11B, the first conductive layer 240 is partially removed by performing an etching process using the first spacer 250 as an etching mask to form a plurality of first conductive layer patterns 245. In example embodiments, each of the first conductive layer patterns 245 may extend along the first direction and a plurality of first conductive layer patterns 245 may be spaced apart from one another along the second direction.

Figure 12A:
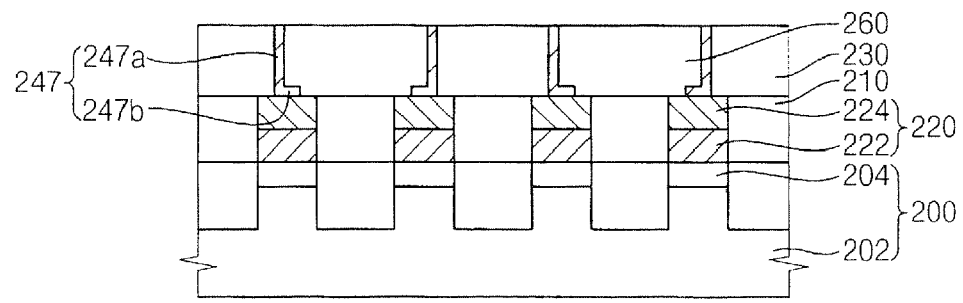
Figure 12B:
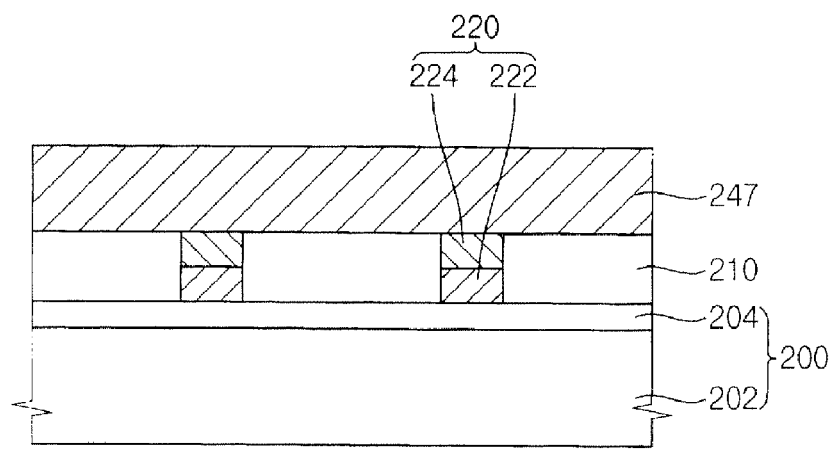

Referring to FIGS. 12A and 12B, a third insulation layer is formed on the first insulation layer patterns 210, the first conductive layer patterns 245 and the diode 220 to fill up the second trench 215. The third insulation layer may be formed using silicon oxide. A planarization process is performed at the third insulation layer and the first conductive layer patterns 245 to form third insulation layer patterns 260 and first electrodes 247. Each of the third insulation layer patterns 260 may be prolonged along the first direction and a plurality of third insulation layer patterns 260 may be spaced apart from one another along the second direction. Each of the first electrodes 247 may include a first portion 247a and a second portion 247b and extend along the first direction. The first portion 247a may be formed on the diode 220 and a sidewall of the second insulation layer pattern 230 along a direction substantially perpendicular to the substrate 200 and the second portion 247b may be formed on the diode 220 along the first direction.

Figure 13A:
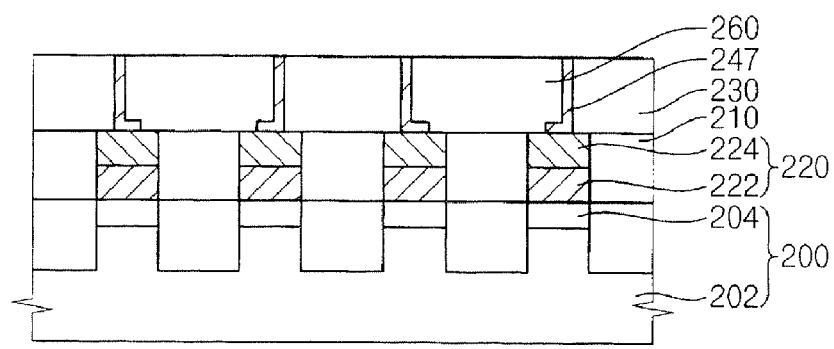
Figure 13B:
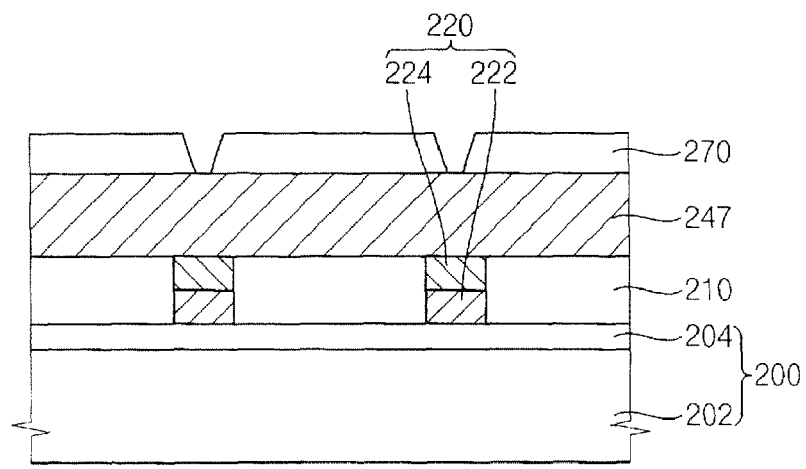

Referring to FIGS. 13A and 13B, a second spacer 270 partially exposing the first electrodes 247 is formed on the on the third insulation layer patterns 260, the second insulation layer patterns 230 and the first electrodes 247. The second spacer 270 may extend along the second direction. The second spacer 270 may be formed using an insulation material having an etching selectivity relative to the second and third insulation layer patterns 230 and 260.

A plurality of second spacers 270 may be spaced apart from one another along the first direction. In example embodiments, the exposed portion of the first electrodes 247 by the second spacer 270 may have a width of about 30 nm to about 50 nm along the first direction.

Figure 14A:
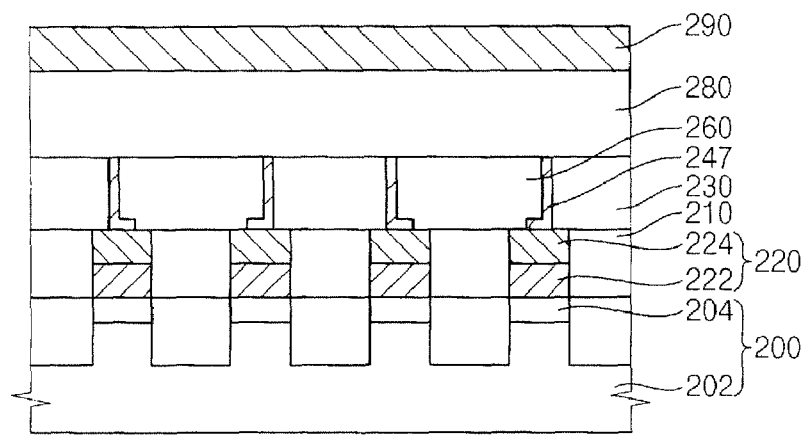
Figure 14B:
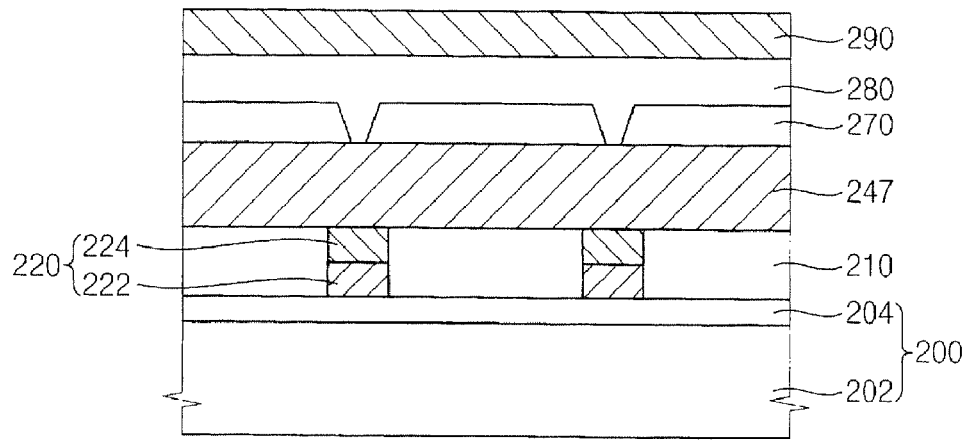

Referring to FIGS. 14A and 14B, a phase-change material layer 280 and a second electrode 290 are sequentially formed on the second spacer 270, the second and third insulation layer patterns 230 and 260 and the first electrodes 247, and may completely cover the first electrodes 247.

The phase-change material layer 280 may be formed using a chalcogenide material such as GST, GST doped with carbon, nitrogen and/or a metal, etc. by a PVD process, such as a sputtering process. The second electrode 290 may be formed using a metal and/or a metal compound such as a metal nitride, a metal silicon nitride, etc. by a deposition process, such as an ALD process, a CVD process, a sputtering process, a cyclic CVD process, an EBD process, etc.

Figure 15A:
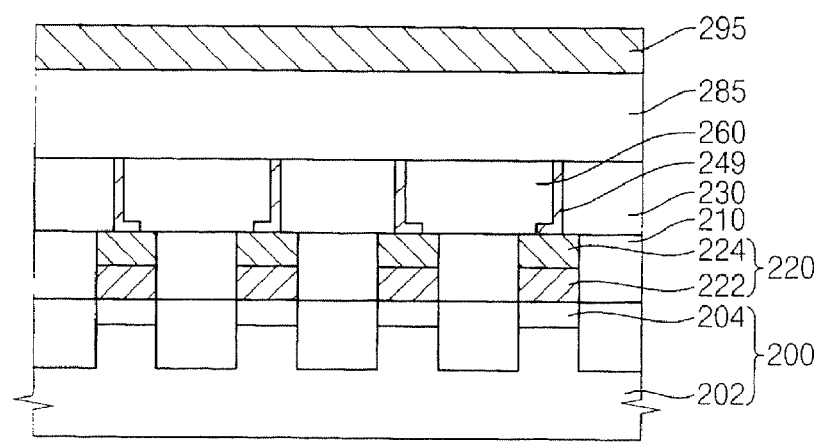
Figure 15B:
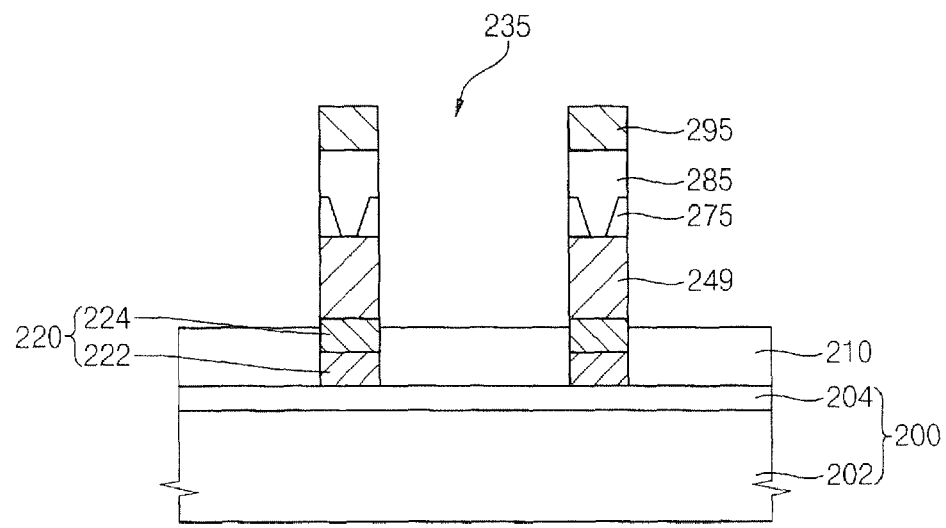

Referring to FIGS. 15A and 15B, portions of the second electrode 290, the phase-change material layer 280, the second spacer 270, the second and third insulation layer patterns 230 and 260 and the first electrodes 247 are removed to form a second opening 235. In example embodiments, the first insulation layer patterns 210 may be partially removed during formation of the second opening 235. The second opening 235 may be extended along the second direction and a plurality of second openings 235 may be spaced apart from one another along the first direction. A phase-change memory unit including a first electrode pattern 249, second spacer patterns 275, a phase-change material layer pattern 285 and a second electrode pattern 295 is formed on the substrate 200 including the diode 220 as a switch element. A plurality of phase-change memory units may be spaced apart from one another along the first direction.

In example embodiments, a photolithography process may further performed using a photoresist pattern extending along the first direction to partially remove the second electrode pattern 295 and the phase-change material layer pattern 285. Accordingly, a plurality of second electrode patterns 295 and a plurality of phase-change material layer patterns 285 may have an isolated island shape.

Figure 16A:
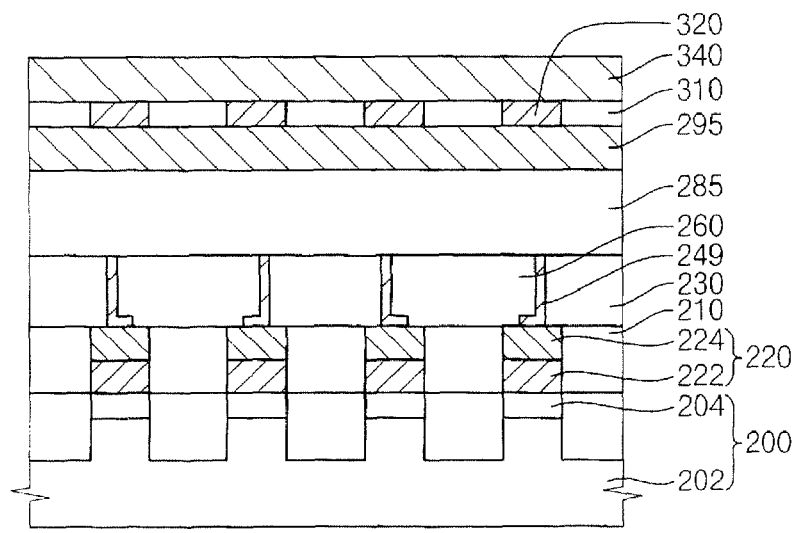
Figure 16B:
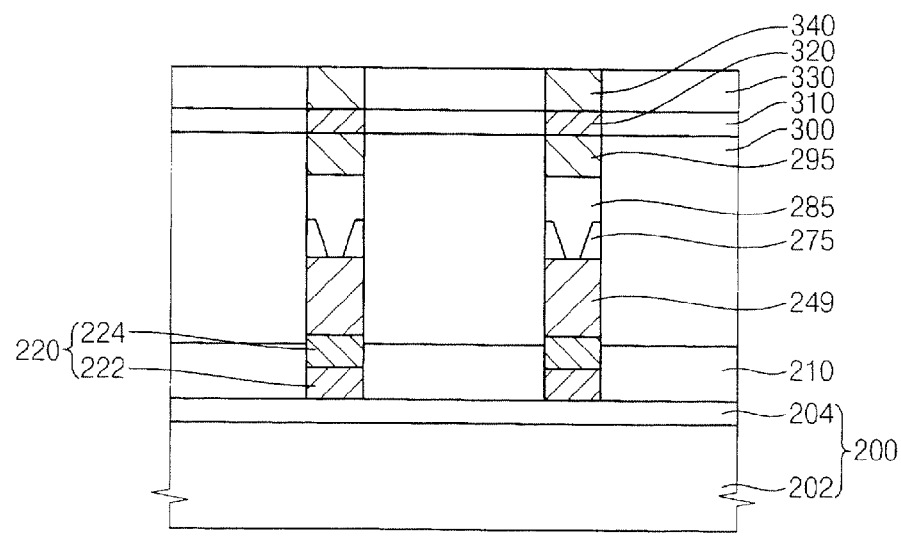

Referring to FIGS. 16A and 16B, a fourth insulation layer is formed on the first insulation layer pattern 210 to cover the phase-change memory unit. The fourth insulation layer is planarized until the second electrode pattern 295 is exposed to form a fourth insulation layer pattern 300.

A plurality of bit line contacts 320 is formed using a conductive material on the second electrode patterns 295. Each of the bit line contacts 320 may correspond to the phase-change memory unit. A fifth insulation layer is formed to cover the bit line contacts 320. The fifth insulation layer is planarized to form a fifth insulation layer pattern 310.

A second conductive layer is formed on the bit line contacts 320 and the fifth insulation layer pattern 310. The second conductive layer may be formed using a metal or a metal compound such as a metal nitride, metal silicon nitride, etc. by a deposition process, such as an ALD process, a CVD process, a sputtering process, a cyclic CVD process, an EBD process, etc. An etching process is performed using a photoresist pattern extending along the second direction to form a plurality of bit lines 340 electrically connected to the bit line contacts 320.

After a sixth insulation layer covering the bit lines 340 is formed, the sixth insulation layer is planarized to form a sixth insulation layer pattern 330.

Figure 17A:
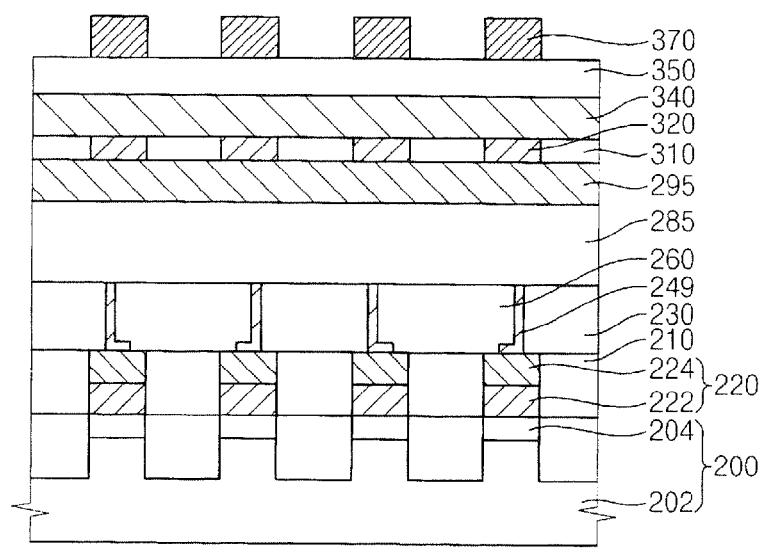
Figure 17B:
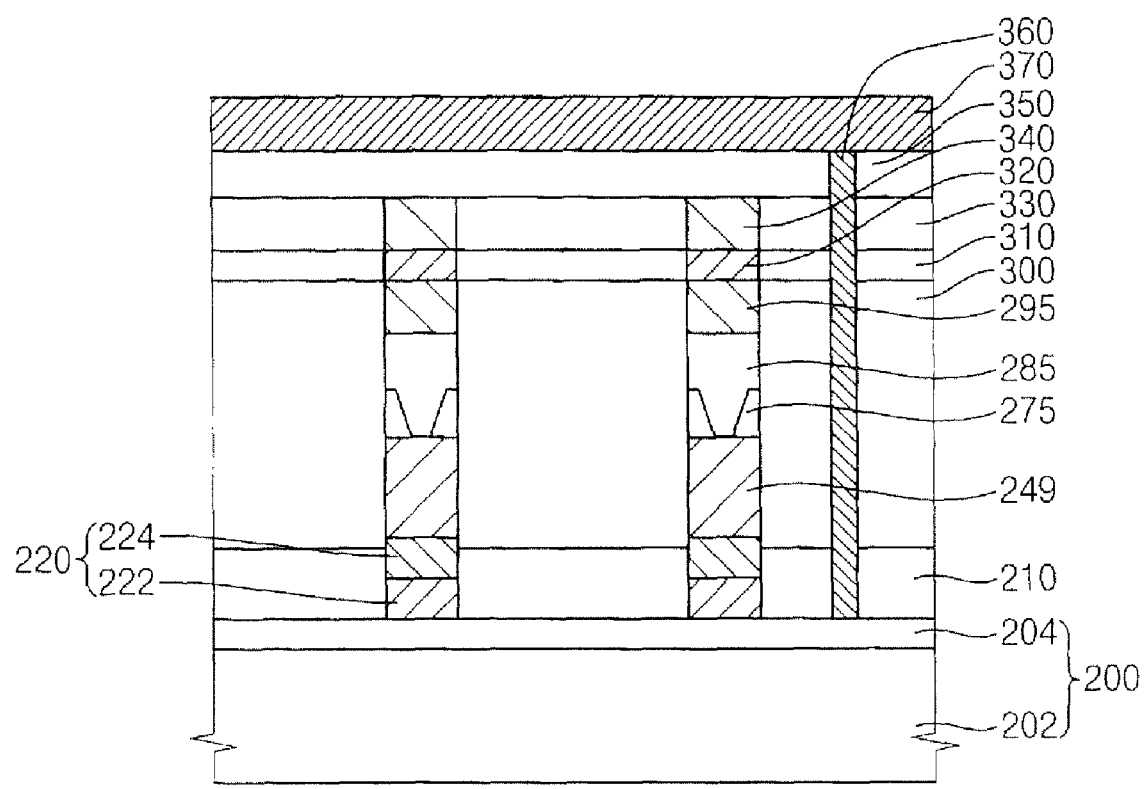

Referring to FIGS. 17A and 17B, a seventh insulation layer 350 is formed on the bit line 340 and the sixth insulation layer pattern 330. The seventh insulation layer 350, the sixth insulation layer pattern 330, the fifth insulation layer pattern 310, the fourth insulation layer pattern 300 and the first insulation layer pattern 210 are partially removed to form a third opening. The third opening is filled with a conductive material to form a word line contact 360 on the first impurity region pattern 204.

A third conductive layer is formed on the word line contact 360 and the seventh insulation layer 350. The third conductive layer may be formed using a metal and/or a metal compound such as a metal nitride, metal silicon nitride, etc. by a deposition process, such as an ALD process, a CVD process, a sputtering process, a cyclic CVD process, an EBD process, etc. An etching process is performed using a photoresist pattern extending along the first direction to form a plurality of word lines 370 electrically connected to the word line contact 360, thereby completing the phase-change memory device.

According to some example embodiments, a phase-change memory unit may have a small contact area between a first electrode and a phase-change material layer. That is, the width of a contact area along a second direction may be determined by the thickness of a first conductive layer. A first conductive layer having a relatively small thickness may be formed, for example, by an ALD process. The width of the contact area along a first direction may be adjusted during formation of a second spacer, and may thereby have a small value. Accordingly, high Joule's heat may be obtained by low currents through the first electrode to form a phase-change memory unit having low reset/set currents.

The second spacer may define a contact area between the first electrode and the phase-change material layer. Thus, the contact area between the first electrode and the phase-change material layer may not be affected by damage due to an etching process for forming a phase-change material layer pattern, so that deterioration of the phase-change material layer pattern may be reduced and/or prevented.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming a phase-change memory unit, comprising:
 providing a substrate having a trench;
 forming a conductive layer on the substrate and on the trench;
 selectively removing portions of the conductive layer on a lower face of the trench to form a plurality of conductive layer patterns wherein the conductive layer patterns partially expose the lower face of the trench;
 forming an insulation layer to fill up the trench;
 planarizing the insulation layer and the conductive layer patterns until an upper surface of the substrate is exposed to form first electrodes having top surfaces that are coplanar with the upper surface of the substrate;
 forming a spacer layer on the upper surface of the substrate, on the insulation layer, and on the top surfaces of the first electrodes;
 patterning the spacer layer to form a spacer that partially covers the top surfaces of the first electrodes and that exposes portions of the top surfaces of the first electrodes;
 forming a phase-change material layer on the exposed portions of the top surfaces of the first electrodes and on the spacer; and
 forming a second electrode on the phase-change material layer.

2. The method of claim 1, wherein the spacer comprises a second spacer, the spacer layer comprises a second spacer layer, and wherein selectively removing portions of the conductive layer on the lower face of the trench comprises:
 forming a first spacer layer on the conductive layer;
 selectively removing portions of the first spacer layer to form a first spacer;
 etching exposed portions of the conductive layer using the first spacer as an etching mask to selectively remove the exposed portions of the conductive layer on the lower face of the trench; and
 removing the first spacer.

3. The method of claim 1, further comprising forming a plurality of trenches in the substrate and spaced apart along a second direction, wherein each of the trenches extends along a first direction that is substantially perpendicular to the second direction.

4. A method of forming a phase-change memory unit, comprising:
 forming a plurality of trenches in a substrate and spaced apart along a second direction, wherein each of the trenches extends along a first direction that is substantially perpendicular to the second direction;
 forming a conductive layer on the substrate and on the trenches;
 forming a first spacer layer on the conductive layer;
 selectively removing portions of the first spacer layer to form a plurality of first spacers spaced apart along the second direction, each of the plurality of first spacers extending along the first direction and partially covering the conductive layer on sidewalls and lower faces of the trenches;
 etching the conductive layer using the plurality of first spacers as an etching mask to selectively remove portions of the conductive layer from the lower faces of the trenches to form a plurality of conductive layer patterns wherein the conductive layer patterns partially expose the lower faces of the trenches;
 removing the plurality of first spacers;
 forming an insulation layer to fill up the trenches;
 planarizing the insulation layer and the conductive layer patterns until an upper surface of the substrate is exposed to form first electrodes having top surfaces that are coplanar with the upper surface of the substrate;
 forming a second spacer layer on the upper surface of the substrate, on the insulation layer, and on the top surfaces of the first electrodes;
 patterning the second spacer layer to form a second spacer that partially covers the top surfaces of the first electrodes and that exposes portions of the top surfaces of the first electrodes;
 forming a phase-change material layer on the exposed portions of the top surfaces of the first electrodes and on the second spacer; and
 forming a second electrode on the phase-change material layer.

5. The method of claim 4, wherein the second spacer comprises a plurality of second spacers that are spaced apart along the first direction and that extend along the second direction.

6. The method of claim 5, further comprising selectively removing portions of the second electrode, the phase-change material layer, the second spacers and the first electrode to form a plurality of openings exposing the substrate and extending along the second direction.

* * * * *